United States Patent
Zhang et al.

(10) Patent No.: US 9,337,087 B1
(45) Date of Patent: May 10, 2016

(54) MULTILAYER STRUCTURE IN AN INTEGRATED CIRCUIT FOR DAMAGE PREVENTION AND DETECTION AND METHODS OF CREATING THE SAME

(71) Applicants: STMicroelectronics, Inc., Coppell, TX (US); International Business Machines Corporation, Armonk, NY (US)

(72) Inventors: John H. Zhang, Altamont, NY (US); Lawrence A. Clevenger, LaGrangeville, NY (US); Carl Radens, LaGrangeville, NY (US); Yiheng Xu, Hopewell Junction, NY (US); Byoung Youp Kim, Niskayuna, NY (US); Walter Kleemeier, Albany, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/586,688

(22) Filed: Dec. 30, 2014

(51) Int. Cl.
*H01L 21/4763* (2006.01)
*H01L 21/768* (2006.01)
*H01L 23/522* (2006.01)

(52) U.S. Cl.
CPC .... *H01L 21/76843* (2013.01); *H01L 21/76802* (2013.01); *H01L 23/5222* (2013.01); *H01L 23/5226* (2013.01); *H01L 23/5227* (2013.01); *H01L 23/5228* (2013.01)

(58) Field of Classification Search
CPC ............ H01L 29/4925; H01L 23/5226; H01L 21/76879
USPC .......... 438/622, 637, 672, 675; 257/750, 758, 257/774
See application file for complete search history.

(56) References Cited

U.S. PATENT DOCUMENTS

| | | | | |
|---|---|---|---|---|
| 5,471,091 A * | 11/1995 | Pasch | ................... | H01L 21/3105 257/752 |
| 6,913,946 B2 * | 7/2005 | Lin | ...................... | H01L 21/7682 257/E21.581 |
| 2004/0018720 A1 * | 1/2004 | Kuo | ..................... | B81C 1/00619 438/637 |
| 2007/0224753 A1 * | 9/2007 | Tang | .................. | H01L 27/10876 438/212 |
| 2012/0228774 A1 * | 9/2012 | Furuhashi | ......... | H01L 21/76807 257/762 |
| 2015/0235922 A1 * | 8/2015 | Chen | ...................... | H01L 23/481 257/383 |

\* cited by examiner

*Primary Examiner* — Sheila V Clark
(74) *Attorney, Agent, or Firm* — Seed IP Law Group PLLC

(57) ABSTRACT

Various embodiments facilitate die protection for an integrated circuit. In one embodiment, a multilayer structure is formed in multiple levels and along the edges of a die to prevent and detect damages to the die. The multilayer structure includes a support layer, a first plurality of dielectric pillars overlying the support layer, a metal layer that fills spaces between the first plurality of dielectric pillars, an insulation layer overlying the first plurality of dielectric pillars and the metal layer, a second plurality of dielectric pillars overlying the insulation layer, and a second metal layer that fills spaces between the second plurality of dielectric pillars.

16 Claims, 16 Drawing Sheets

MULTILAYER STRUCTURE IN AN INTEGRATED CIRCUIT FOR DAMAGE PREVENTION AND DETECTION AND METHODS OF CREATING THE SAME

BACKGROUND

1. Technical Field

The present disclosure is directed to a multilayer structure in an integrated circuit for damage prevention and detection and methods of creating the same.

2. Description of the Related Art

As integrated circuits get smaller and denser, damages to dice become critical. Any damages, such as cracks or moisture exposure, to the dice may result in defects in the integrated circuits. Current methods for preventing damages to dice include forming protective structures on the edges of each die. For example, structures may be formed on respective corners of a square shaped die at the end of a fabrication process to minimize damages caused by wafer dicing.

Current methods, however, do not protect damages that may occur throughout a fabrication process. That is, current methods do not prevent damages that may occur during the fabrication of each level, such as a via level or a metal level, of a die. Current methods also cannot be performed simultaneously with the fabrication of electrical components of an integrated circuit and require additional fabrication steps to form protective structures. This results in increased fabrication time and cost. In addition, current methods do not allow damages to dice to be detected throughout fabrication.

BRIEF SUMMARY

The present disclosure provides a multilayer structure that is formed in multiple levels and in the edges of a die. The multilayer structure prevents damages to dice, provides testing channels for electrical and optical probes to detect damages to dice, and provides a support structure for a controlled-collapse chip connection (C4) process.

According to one embodiment, a multilayer structure includes a support layer, a first plurality of dielectric pillars overlying the support layer, a metal layer that fills spaces between the first plurality of dielectric pillars, an insulation layer overlying the first plurality of dielectric pillars and the metal layer, a second plurality of dielectric pillars overlying the insulation layer, and a second metal layer that fills spaces between the second plurality of dielectric pillars.

The multilayer structure disclosed herein results in increased die protection throughout a fabrication process of a die and wafer dicing. In addition, the multilayer structure may be fabricated simultaneously with the fabrication of an electrical components structure. This results in reduced fabrication time and costs.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
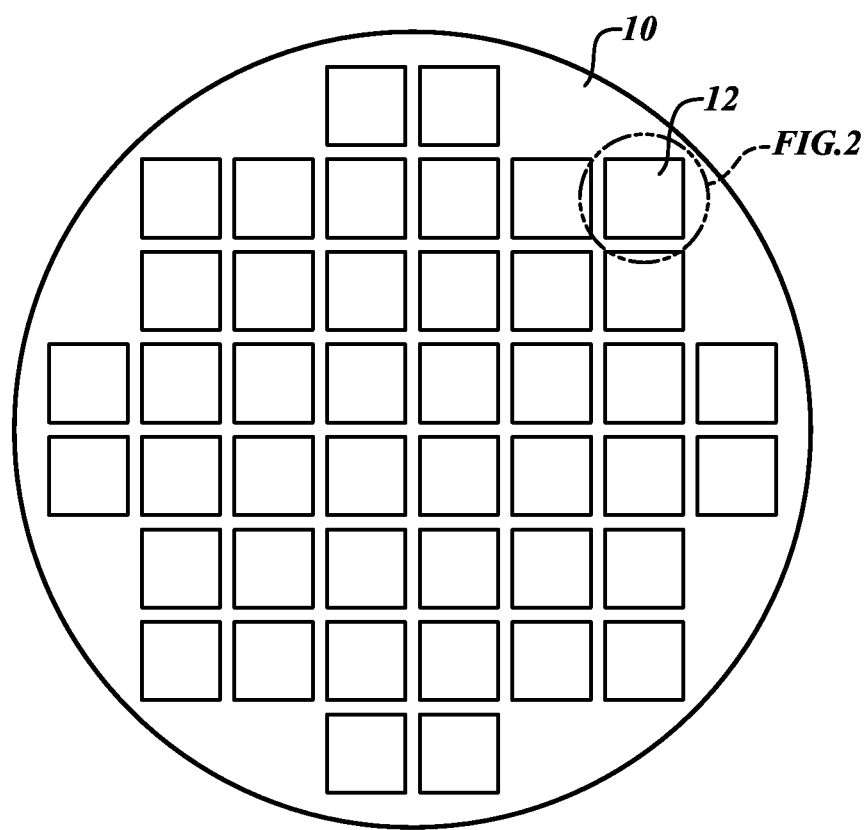
FIG. 1 is a plan view of a wafer according to one embodiment as disclosed herein.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

A. Overview

FIG. 1 is a plan view illustrating an example of a wafer 10 according to principles disclosed herein. In this example, the wafer 10 includes dice 12 arranged on the wafer 10.

The wafer 10 may be formed of monocrystalline silicon or other suitable semiconductor material. The dice 12 are formed by forming and patterning a series of materials on the wafer 10.

Figure 2:
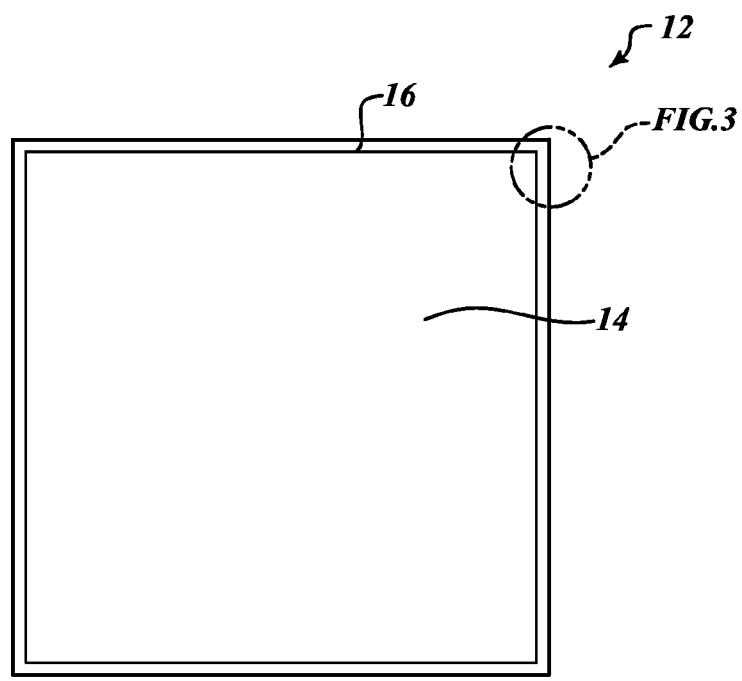
FIG. 2 is a plan view of a die from the wafer shown in FIG. 1 according to one embodiment as disclosed herein.

FIG. 2 is a plan view illustrating an example of a die 12 from the wafer 10 according to principles disclosed herein. In this example, the die 12 includes a central region 14 and a multilayer structure 16.

The central region 14 includes electrical components for an integrated circuit. The electrical components may include active and passive electrical components, such as transistors, inductors, resistors, and capacitors, conductive vias, metal tracks, etc. The central region 14 will be discussed in detail with respect to FIG. 13.

The multilayer structure 16 remains on the die 12 subsequent to wafer dicing. The multilayer structure 16 prevents damages to the central region 14. In addition, as will be discussed in detail with respect to FIG. 14, the multilayer structure 16 provides testing channels for electrical and optical probes to detect damages to the die 12. As will be discussed in detail with respect to FIGS. 4A-11B, the multilayer structure 16 is formed of a plurality of materials. In one embodiment, the die 12 is fabricated using a C4 process and the multilayer structure 16 serves as a support structure. In another embodiment, as will be discussed in detail with respect to FIG. 12, the multilayer structure 16 is formed in each level of the die 12.

In the embodiment shown in FIG. 2, the multilayer structure 16 is formed in the surrounding edge of the die 12. The multilayer structure 16, however, may have any configuration that minimizes damages to the central region 14 throughout fabrication. For example, the multilayer structure 16 may be comprised of four separate structures that border respective corners of the die 12, or four separate structures that border each edge of the die 12. In another embodiment, the die 12 may include multiple multilayer structures. For example, the die 12 may include a second multilayer structure that surrounds the central region 14 and is interior to the multilayer structure 16.

Figure 3:
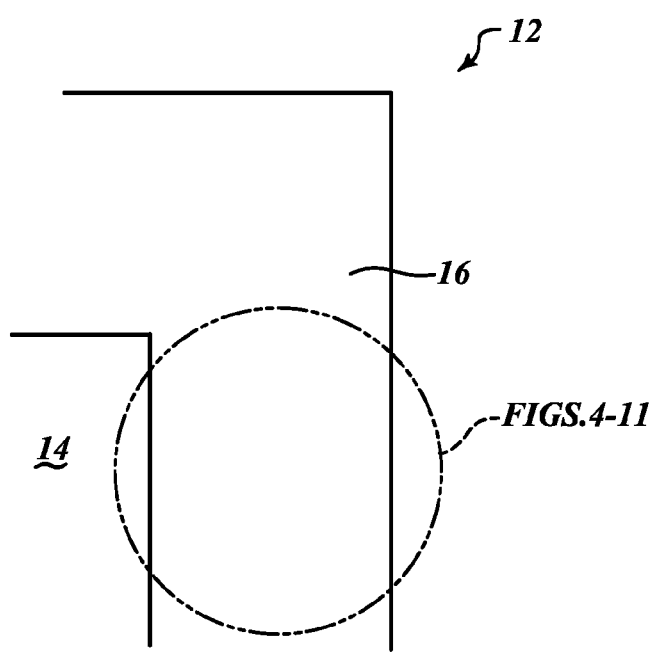
FIG. 3 is an enlarged plan view of a portion of a multilayer structure of the die shown FIG. 2 according to one embodiment as disclosed herein.

FIG. 3 is an enlarged plan view illustrating the portion of the multilayer structure 16 shown in FIG. 2 according to principles disclosed herein. The fabrication of the portion of the multilayer structure shown in FIG. 3 will be discussed in detail with respect to FIGS. 4A-12.

B. Example Method for Fabricating a Multilayer Structure

FIGS. 4A-11B are plan views and cross-sectional views illustrating subsequent steps of a method for fabricating the portion of the multilayer structure shown in FIG. 3 according to principles disclosed herein.

The fabrication steps of FIGS. 4A-11B may be performed during the back-end-of-line (BEOL) of an integrated circuit fabrication process, the front-end-of-line (FEOL) of an integrated circuit fabrication process, or the BEOL and the FEOL of an integrated circuit fabrication process. For example, the method may be performed in a metal level or a via level of the die 12. In one embodiment, as will be discussed in detail with respect to FIG. 13, the fabrication steps of FIGS. 4A-11B are performed simultaneously with the fabrication of the central region 14.

Figure 13:
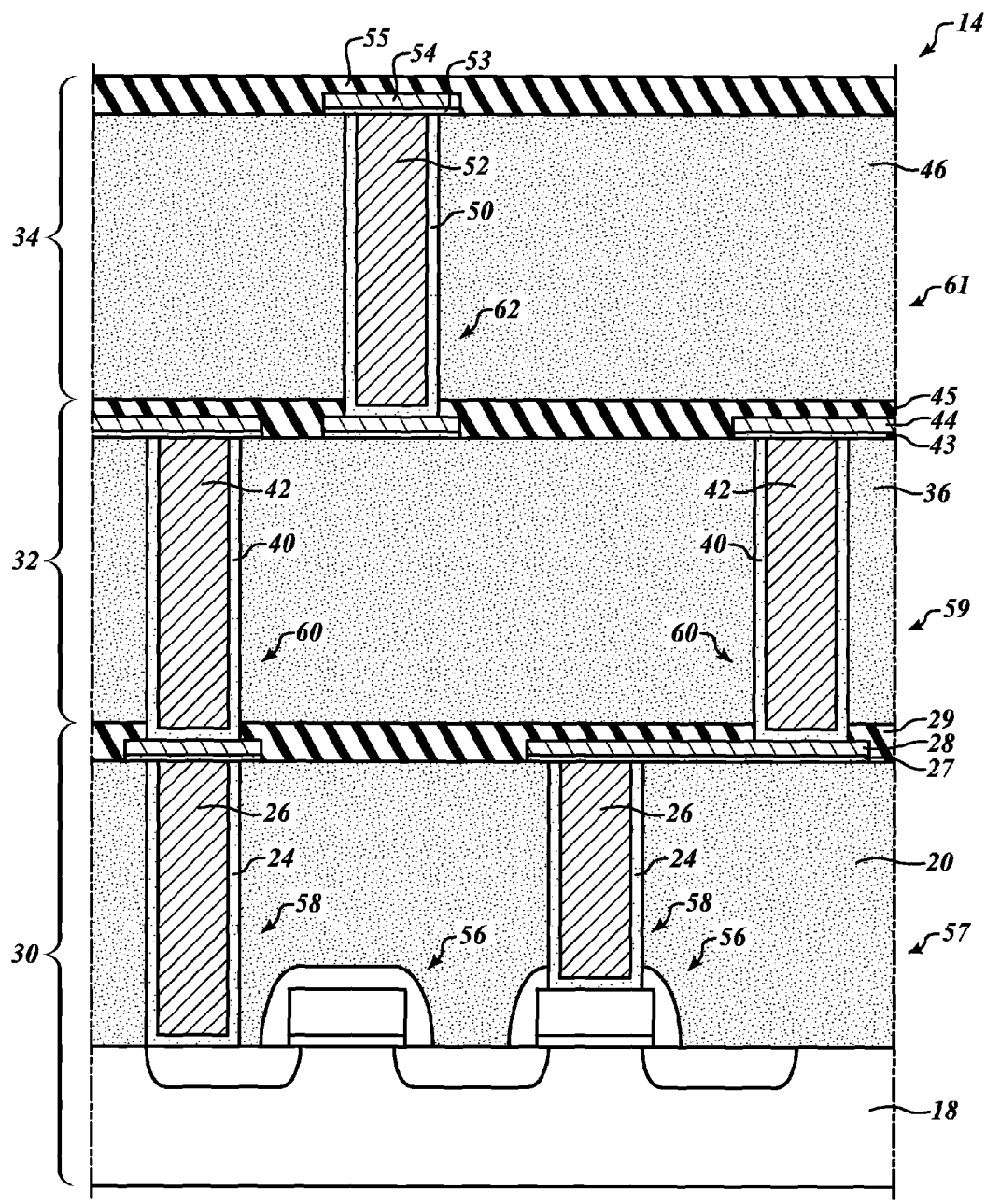
FIG. 13 is a cross-sectional view of an electrical component structure according to one embodiment as disclosed herein.

It is beneficial to review the steps in FIGS. 4A-11B simultaneously with reviewing the steps in the production of the structure of FIG. 13. In particular, FIG. 13 shows the formation of active circuitry in the central region 14 of the die. In the central region 14 of the die, there are a number of electrical structures formed, including transistors and interconnections using various wiring layers with dielectric layers or insulation layers disposed between them. According to the principles of the inventive concepts as disclosed herein, the steps which are used in forming the circuitry as part of the integrated circuit operation are carried out simultaneously in the peripheral ring structure around the very edge of the die in order to form a strong anti-crack structure. In particular, simultaneously with depositing metal layers to make integrated circuit components in the central region 14 of the die as shown in FIG. 13, structural components are formed in the multilayer structure 16 in the peripheral region of the die that forms a full ring around the edge of the die to provide mechanical support and prevent cracking at the edges of the die during sawing, packaging, and later handling of the die. Advantageously, additional steps are not needed to carry out the forming of the thick metal layers; rather, those steps which are already being carried out in the formation of electrical circuit components are used to form mechanical support structures in the peripheral region of the multilayer structure 16 of the die. One difference, as will be explained herein, is that relatively thick metal layers, such as the type used for contact plugs, via plugs, and the like, are used to form the thick metal layers in the multilayer structure 16 in order to provide high mechanical strength in the peripheral region of the die for the multilayer structure 16.

Figure 4A:
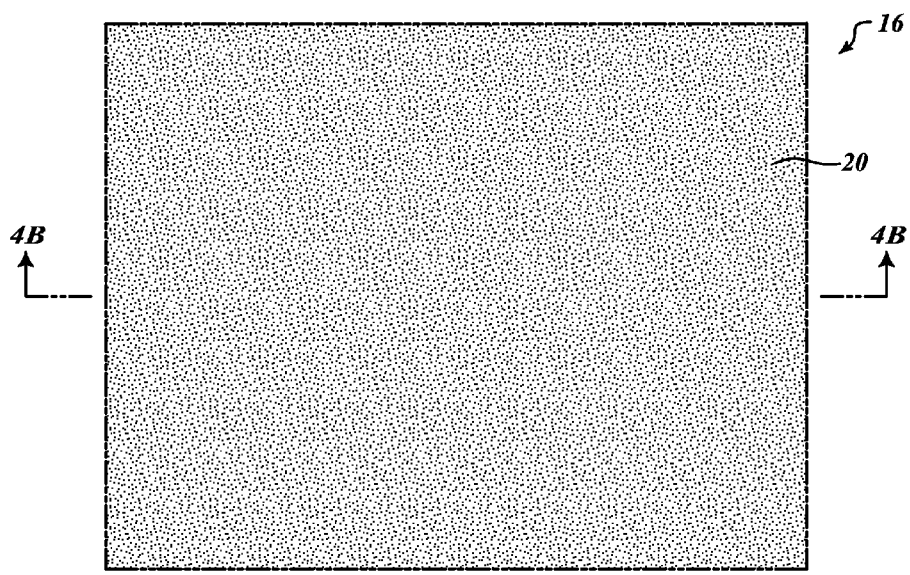
FIGS. 4A-11B are plan views and cross-sectional views illustrating steps of a method for fabricating the portion of the multilayer structure shown in FIG. 3 according to one embodiment as disclosed herein.
Figure 4B:

At the step illustrated in FIGS. 4A-4B, the multilayer structure 16 includes a support layer 18 and dielectric layer 20. FIG. 4A is a plan view of the multilayer structure 16 and FIG. 4B is a cross-sectional view of the multilayer structure 16 along the axis shown in FIG. 4A.

The support layer 18 refers to any layer that has been formed prior to the dielectric layer 20 being formed. For example, in one embodiment, the dielectric layer 20 is a first layer of the multilayer structure 16 and the support layer 18 is a silicon substrate. In another embodiment, as will be discussed in detail with respect to FIG. 12, the dielectric layer 20 is an inter-layer dielectric (ILD) and the support layer 18 is an insulating layer.

The dielectric layer 20 is formed on the support layer 18. The dielectric layer 20 may be an ultra-low-k (ULK) dielectric or a high-k (HK) dielectric. In one embodiment, the dielectric layer 20 has a thickness target of about 250 nm.

Notably, the dielectric layer 20 corresponds to the pre-metal dielectric 20 as shown in FIG. 13. In particular, after the transistors are formed as shown in FIG. 13, a relatively thick pre-metal dielectric 20 is formed. At the same time this is formed in the central region 14, it is simultaneously formed in the multilayer structure 16.

Figure 5A:
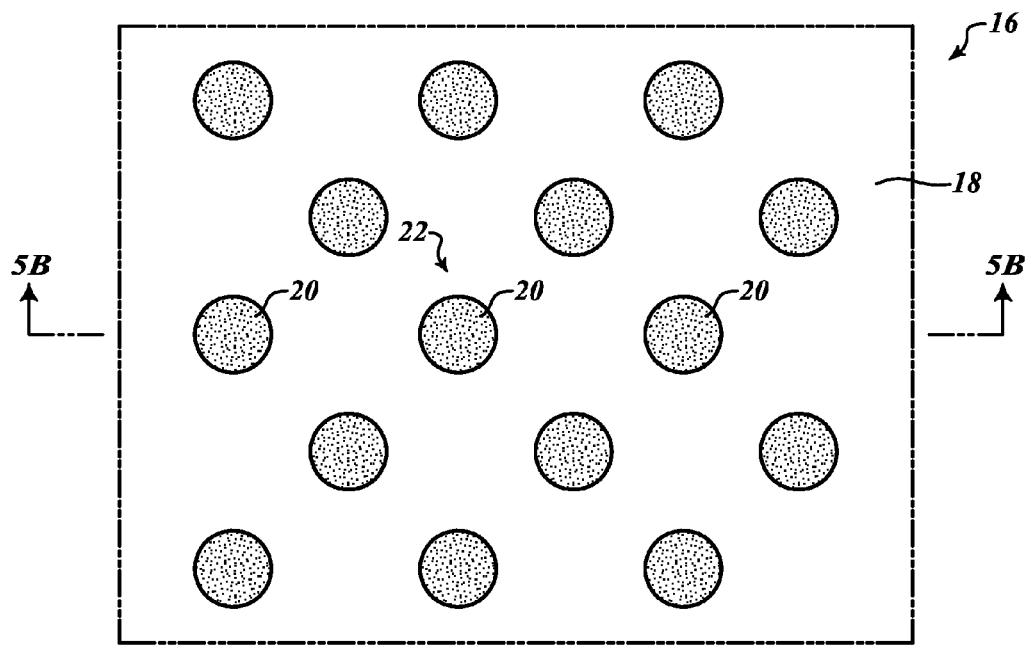
Figure 5B:
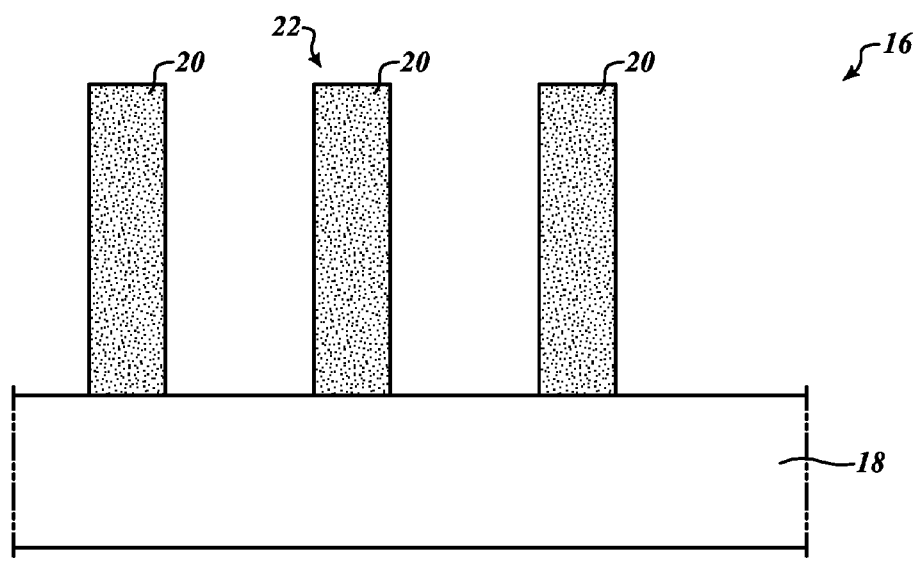

At the step illustrated in FIGS. 5A-5B, the dielectric layer 20 is patterned in to pillars 22. FIG. 5A is a plan view of the multilayer structure 16 and FIG. 5B is a cross-sectional view of the multilayer structure 16 along the axis shown in FIG. 5A.

The pillars 22 are patterned in the dielectric layer 20 by using techniques now known or later developed. For example, the pillars 22 may be patterned by conventional lithography and reactive ion etching (RIE) processes. In one embodiment, the pillars 22 are patterned using a via mask. That is, the same via mask used to pattern conductive vias for the die 12 is used to pattern the pillars 22. This results in decreased fabrication time and cost. In one embodiment, the pillars 22 have a target width of about 120 nm.

In the embodiment shown in FIG. 5A, the pillars 22 are patterned such that each row of the pillars 22 are at least partially offset from adjacent rows of pillars. The pillars 22, however, may have any arrangement. In one embodiment, as will be discussed in detail with respect to FIGS. 15-17, the dielectric layer 20 is patterned to form passive electrical components, such as inductors, resistors, and capacitors, for testing purposes.

Although the pillars 22 shown in FIGS. 5A-5B have cross-sections that are circular, the pillars 22 may have any shape. For example, the pillars 22 may have cross-sections that are polygonal.

Figure 6A:
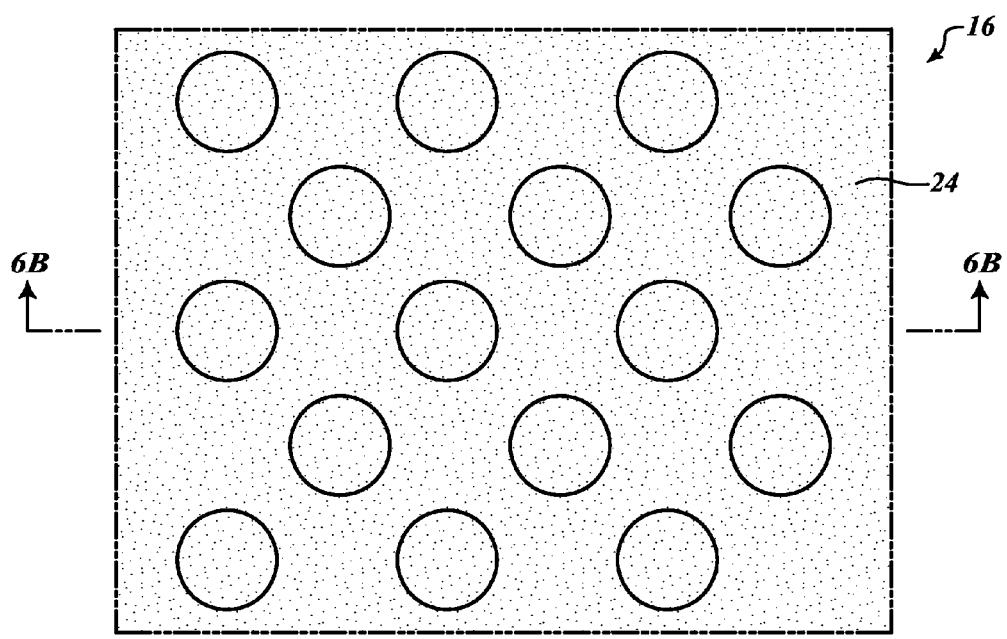
Figure 6B:
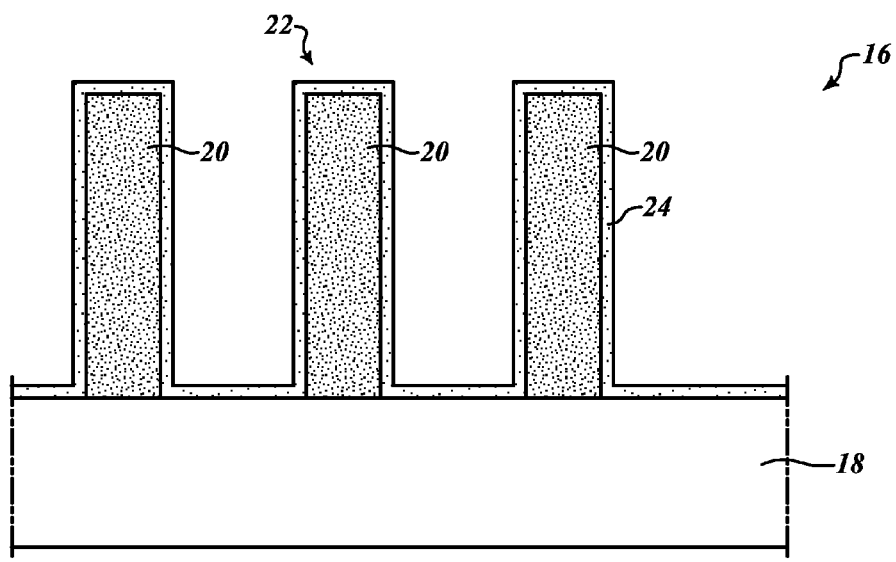

At the step illustrated in FIGS. 6A-6B, a conformal, thin liner 24 is formed on the pillars 22 and the support layer 18. FIG. 6A is a plan view of the multilayer structure 16 and FIG. 6B is a cross-sectional view of the multilayer structure 16 along the axis shown in FIG. 6A.

The liner 24 forms a barrier between the support layer 18, the dielectric layer 20 and metal to be subsequently formed. The liner 24 is formed on the pillars 22 and the support layer 18 by using techniques now known or later developed.

The liner 24 may be made of materials commonly used for liners. For example, the liner 24 may include tantalum nitride (TaN), titanium, or titanium nitride (TiN). In one embodiment, the liner 24 has a target thickness of 3 nm-8 nm, preferably 5 nm.

Figure 7A:
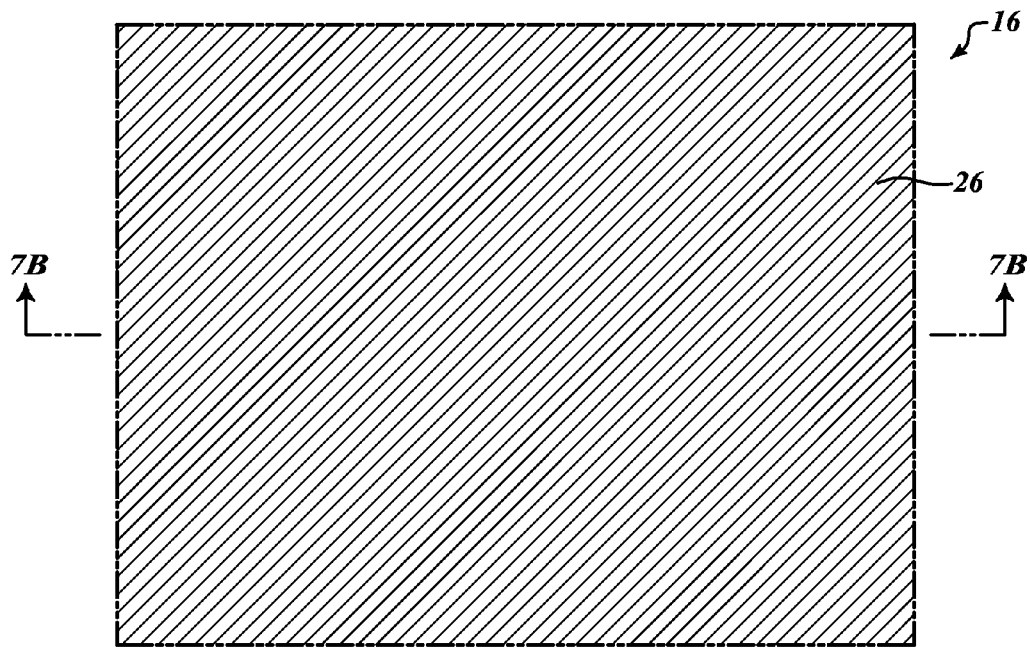
Figure 7B:
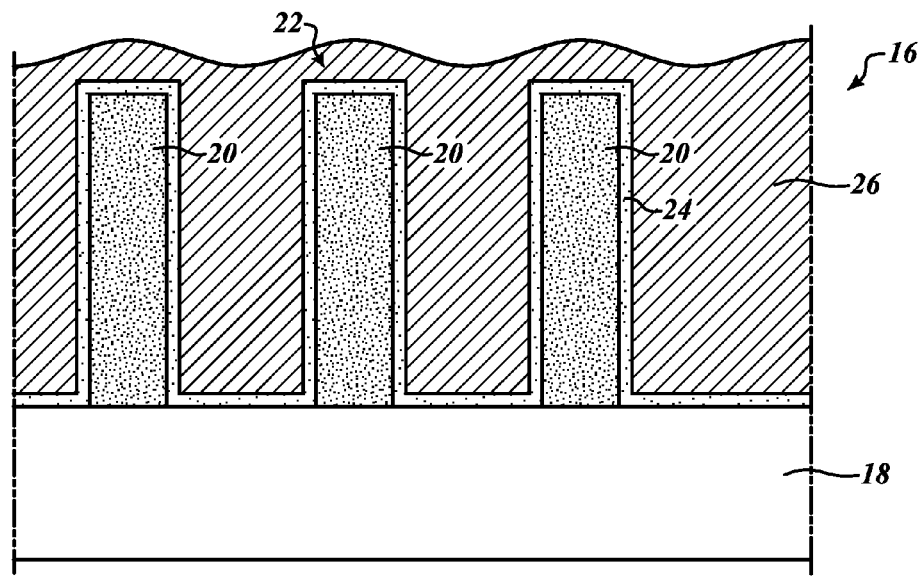

At the step illustrated in FIGS. 7A-7B, spaces surrounding the pillars 22 are at least partially filled with metal by forming a metal plug layer 26 on the liner 24. FIG. 7A is a plan view of the multilayer structure 16 and FIG. 7B is a cross-sectional view of the multilayer structure 16 along the axis shown in FIG. 7A.

The metal plug layer 26 is formed by using techniques now known or later developed. For example, the metal plug layer 26 may be formed by a plasma deposition process, such as chemical vapor deposition (CVD) or plasma vapor deposition (PVD), or a plating process, such as electroplating or electroless plating. The forming of the metal plug layer 26 is preferably conformal to ensure that all spaces surrounding the pillars 22 are completely filled.

The metal plug layer 26 may be made of materials commonly used for integrated circuits. For example, the metal plug layer 26 may include copper, aluminum, tungsten, silver, gold, titanium, platinum, tantalum, or combinations thereof. In the situation in which the support layer 18 is the semiconductor substrate itself, the lowermost metal plug layer 26 will likely be tungsten, such as a tungsten plug of the type shown in FIG. 13. For upper metal layers, the metal layer may be copper or aluminum.

As can be seen, since common reference numbers are used for common layers in FIGS. 4A-11B as also used in FIG. 13, when the liner 24 is deposited in the peripheral region of the die, it corresponds to the tungsten plug liner or the copper plug liner being deposited in the central region 14 of the die 12. Then, when the metal plugs are formed, such as the tungsten plug, or the copper plug, or the like, as is done in a damascene or dual-damascene process, the thick metal plug layer 26 is then formed in the multilayer structure 16 at the same time. In the active circuit portion, metal plug layer 26 make up only a small portion of the layer between the transistor gates and the first metal layer, and are commonly referred to as plugs because they fill deep holes that have been etched into the dielectric layer 20. However, in the multilayer structure 16, the metal plug layer 26 makes up the vast bulk, over 60% of the total volume, of the multilayer structure 16. Metal is significantly stronger and more robust than the ULK dielectric, and therefore has the benefit of providing more mechanical strength to prevent cracking in the central region 14.

Figure 8A:
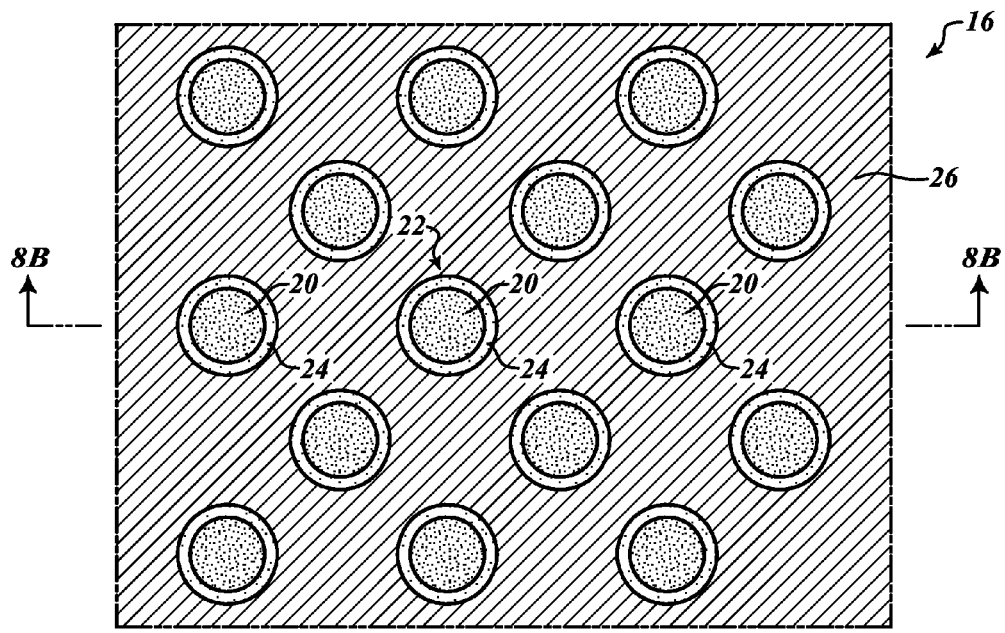
Figure 8B:
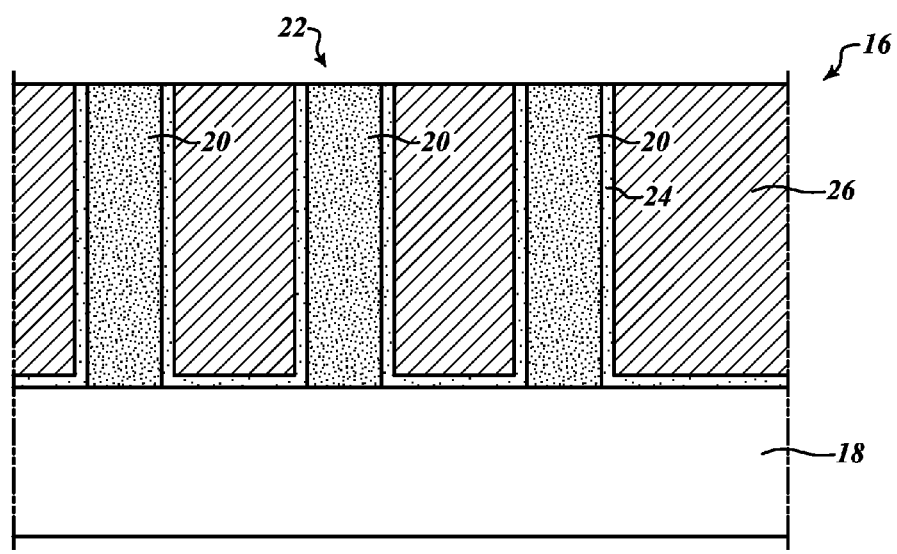

As shown in FIG. 7B, the uppermost surface of the metal plug layer 26 may have unevenness and irregularity after the metal 26 has been formed. At the step illustrated in FIGS. 8A-8B, a chemical-mechanical planarization (CMP) process is performed to remove the unevenness and irregularity of the uppermost surface of the metal plug layer 26. FIG. 8A is a plan view of the multilayer structure 16 and FIG. 8B is a cross-sectional view of the multilayer structure 16 along the axis shown in FIG. 8A.

The CMP process removes the unevenness and irregularity of the uppermost surface of the metal plug layer 26 and exposes the top faces of the pillars 22 and the liner 24. The CMP process is performed by using techniques now known or later developed. For example, the CMP process may include polishing the uppermost surface of the metal plug layer 26 with a rotating pad and a slurry of chemicals and abrasive particulates.

As will be discussed in detail with respect to FIG. 14, the die 12 is tested for damages subsequent to the CMP process using electrical and optical probes. Particularly, the dielectric layer 20 provides an optical channel and the liner 24 provides an optical reflection layer for optical probes, and the metal plug layer 26 provides an electrical channel for electrical probes.

Figure 9A:
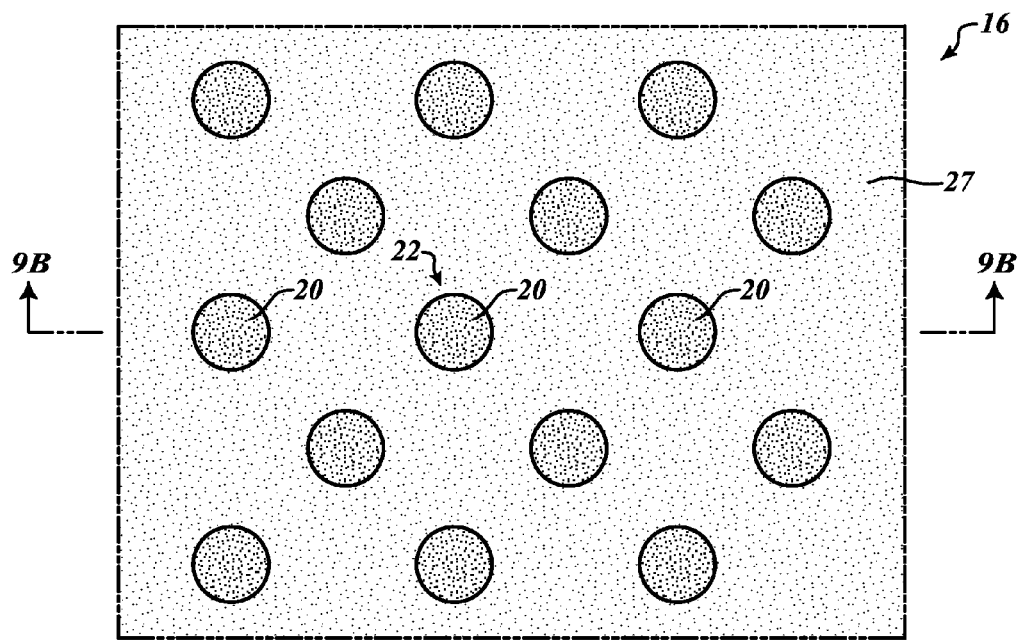
Figure 9B:
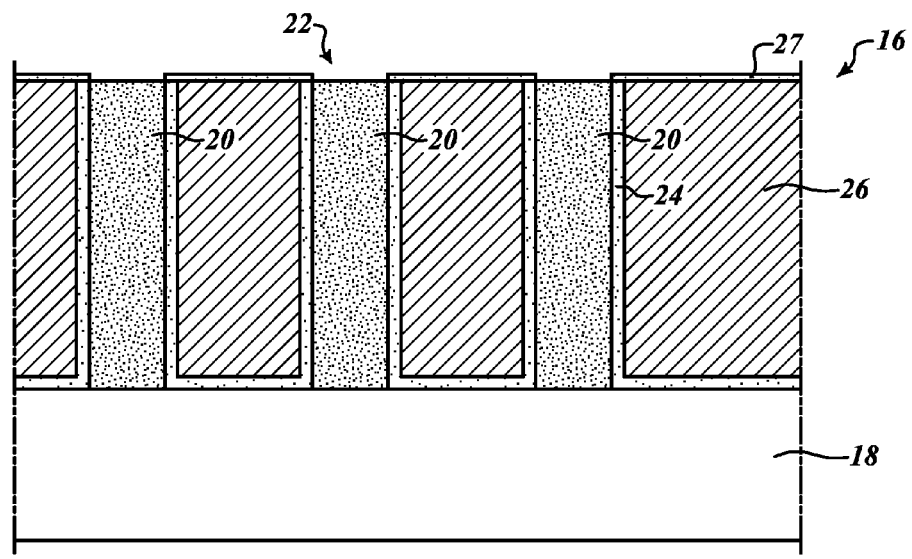

At the step illustrated in FIGS. 9A-9B, a liner 27 is formed on the metal plug layer 26 and the liner 24, leaving the top faces of the pillars 22 exposed. FIG. 9A is a plan view of the multilayer structure 16 and FIG. 9B is a cross-sectional view of the multilayer structure 16 along the axis shown in FIG. 9A.

The liner 27 forms a barrier between the metal plug layer 26 and the liner 24 and metal to be subsequently formed. As discussed with respect to FIGS. 6A-6B, the liner 27 is formed using techniques now known or later developed and may be made of materials commonly used for liners, such as tantalum nitride (TaN), titanium, or titanium nitride (TiN). In one embodiment, the liner 27 has a target thickness of a few nm.

Figure 10A:
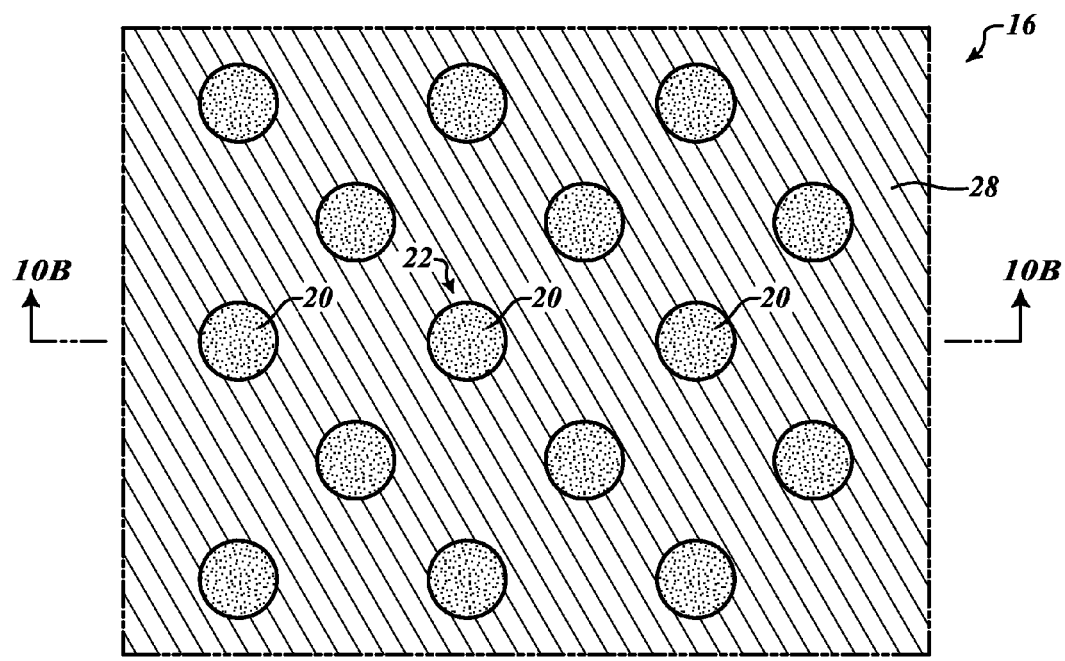
Figure 10B:
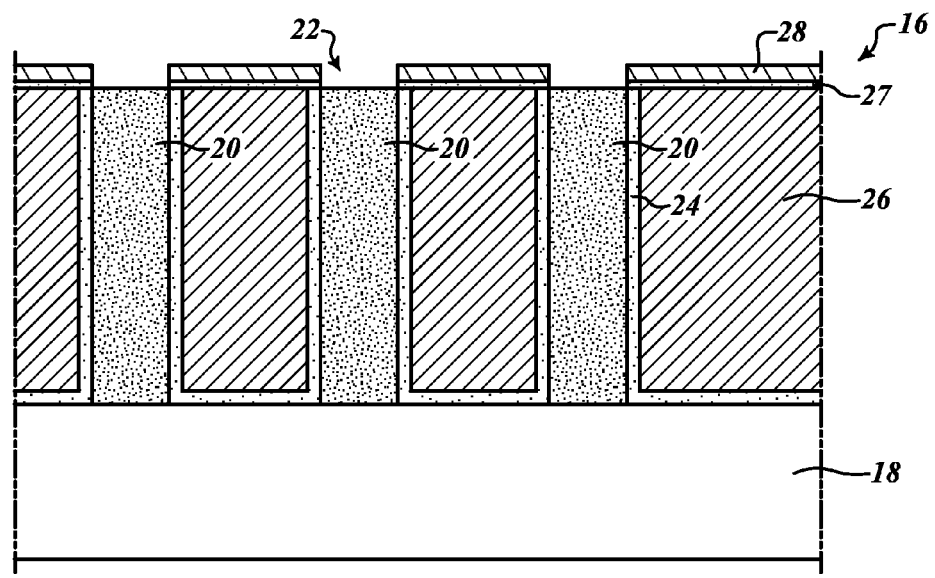

At the step illustrated in FIGS. 10A-10B, a wiring layer 28 is formed on the liner 27, leaving the top faces of the pillars 22 exposed. FIG. 10A is a plan view of the multilayer structure 16 and FIG. 10B is a cross-sectional view of the multilayer structure 16 along the axis shown in FIG. 10A.

The wiring layer 28 provides additional strength to the multilayer structure 16. The wiring layer 28 is formed using techniques now known or later developed and may be made of materials commonly used for integrated circuits, such as copper, aluminum, tungsten, silver, gold, titanium, platinum, tantalum, or combinations thereof.

The wiring layer 28 is traditionally called metal 1 in the formation of the semiconductor structures. The wiring layer 28 forms conductive interconnections for the integrated circuit structures in the central region 14 of the die 12 as shown in FIG. 3. In one embodiment, in the multilayer structure 16, the wiring layer 28 is overlaid exactly on top of the metal plug layer 26 in order to form a contiguous stiff structure. Alternatively, since a different mask is used, it is also possible to overlap the wiring layer 28 with both the dielectric layer 20 and the metal plug layer 26. The multilayer structure 16 is not used for electrical purposes. Accordingly, it is possible in one alternative embodiment to have wiring layer 28 extend as a single contiguous flat sheet across the entire multilayer structure 16. In this alternative embodiment, wiring layer 28 is a continuous and contiguous layer that extends to mechanically and electrically link each of the columns of the metal plug layer 26 to each other, and overlay the dielectric layer 20 within the multilayer structure 16. This provides additional rigidity, greater strength, and aids to prevent cracking.

As explained later herein, it is normally desired that the metal plug layer 26 not take up the entire volume of the multilayer structure 16 in the layer it occupies, but rather have a cross-sectional layer that corresponds to the golden ratio; namely, the metal plug layer 26 takes up approximately 62% of the volume, and also the cross-sectional area of the layer of which it is a part, and the dielectric layer 20 takes up the remaining approximately 28% of the layer of which the metal plug layer 26 is a part. Of course, the dielectric layer 20 will usually be several layers of dielectric, formed as a multilayer, some of which are nitride layers and some of which are oxide layers. Since the metal plug layer 26 is quite thick, particularly as compared to the wiring layer 28, which is a metal wiring layer also used for metal interconnections, it is generally preferred for it to not take up the bulk of the entire layer of which it is a part. Further, since the metal plug layer 26 is planarized using a CMP process that includes both a polishing and an etching, it is preferred to not have it be a large block of metal, since etching characteristics of large blocks of metal vary greatly with different CMP process parameters. On the other hand, the wiring layer 28 is etched with a reactive ion etch, an anisotropic etch, or other etch chemistry, and is not usually polished with a CMP etch. Accordingly, the wiring layer 28 can have a different area than the metal plug layer 26 since it is controlled by a different mask than the metal plug layer 26. Thus, as can be appreciated, the metal plug layer 26 is substantially greater in height, since it is a plug layer, than the wiring layer 28, which is a metal wiring layer also known to those skilled in the art as the metal interconnection layer.

Figure 11A:
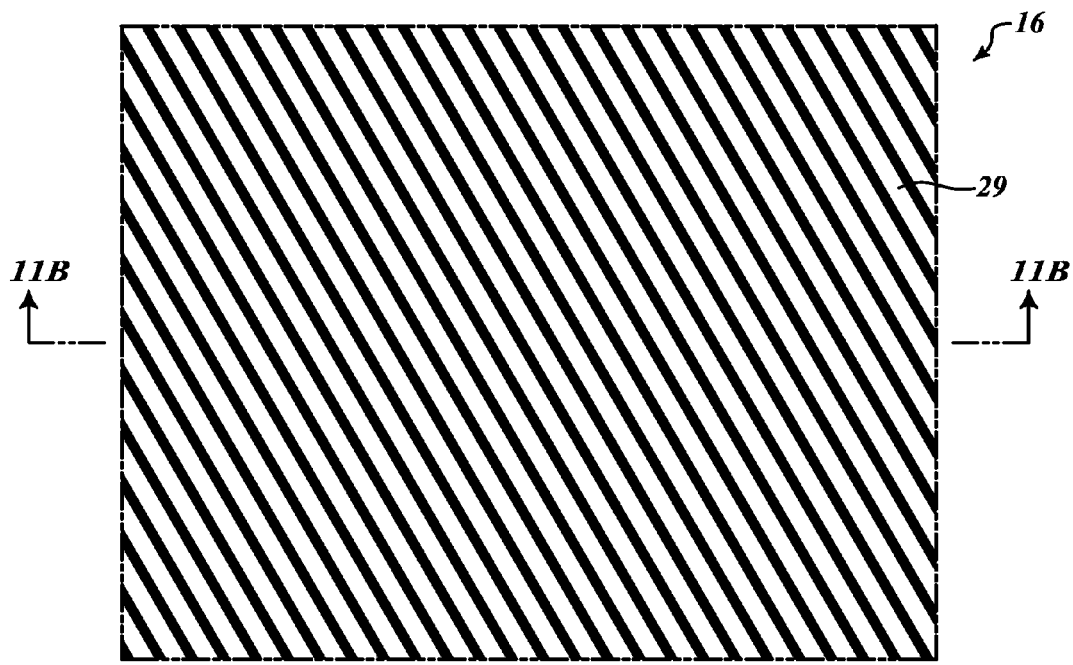
Figure 11B:
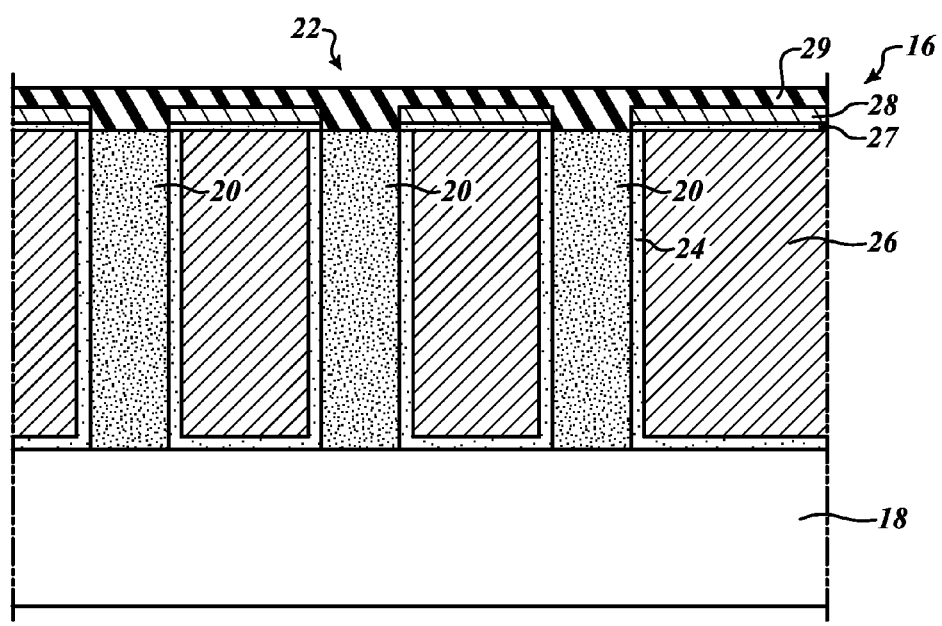

At the step illustrated in FIGS. 11A-11B, an insulating layer 29 is formed on the top faces of the pillars 22 and the wiring layer 28. FIG. 11A is a plan view of the multilayer structure 16 and FIG. 11B is a cross-sectional view of the multilayer structure 16 along the axis shown in FIG. 11A.

The insulating layer 29 is formed by using techniques now known or later developed. The insulating layer 29 may be made of materials commonly used for insulating layers, such as silicon nitride.

In one embodiment, the insulating layer 29 is formed on the top faces of the pillars 22 and the wiring layer 28 as a protective layer. In another embodiment, as will be discussed in detail with respect to FIG. 12, the insulating layer 29 is formed on the pillars 22 and the wiring layer 28 as an intermediary layer between levels of the multilayer structure 16.

In another embodiment, the width of the pillars 22 is adjusted to control the ratio of the metal plug layer 26 and the liner 24 to the dielectric layer 20. For example, referring to FIGS. 8A-8B, the width of the pillars 22 may be patterned such that the ratio of the metal plug layer 26 and the liner 24 to the dielectric layer 20 is approximately equal to the golden ratio. The golden ratio is an empirical number that used in various geometric shapes and patterns. Two quantities, a and b, are in the golden ratio if:

$$\frac{a+b}{a} = \frac{a}{b} = 1.6180339887 \quad (1)$$

where a >b. In other words, the two quantities are in the golden ratio when the sum of both quantities to the larger quantity is equal to the ratio of the larger quantity to the smaller quantity.

As such, referring back to FIGS. 8A-8B, the width of the pillars 22 may be patterned such that the ratio of the metal plug layer 26 and the liner 24 (a) to the dielectric layer 20 (b) satisfies equation (1) and is approximately equal to the golden ratio. By forming the pillars 22, the liner 24, and the metal plug layer 26 in accordance with the golden ratio, dishing and erosion to the central region 14 during a subsequent CMP process is reduced. See U.S. Pat. No. 8,466,560, entitled "Dummy Structures Having a Golden Ratio and Method for Forming the Same."

C. Example Multilayer Structure Having Multiple Levels

Figure 12:
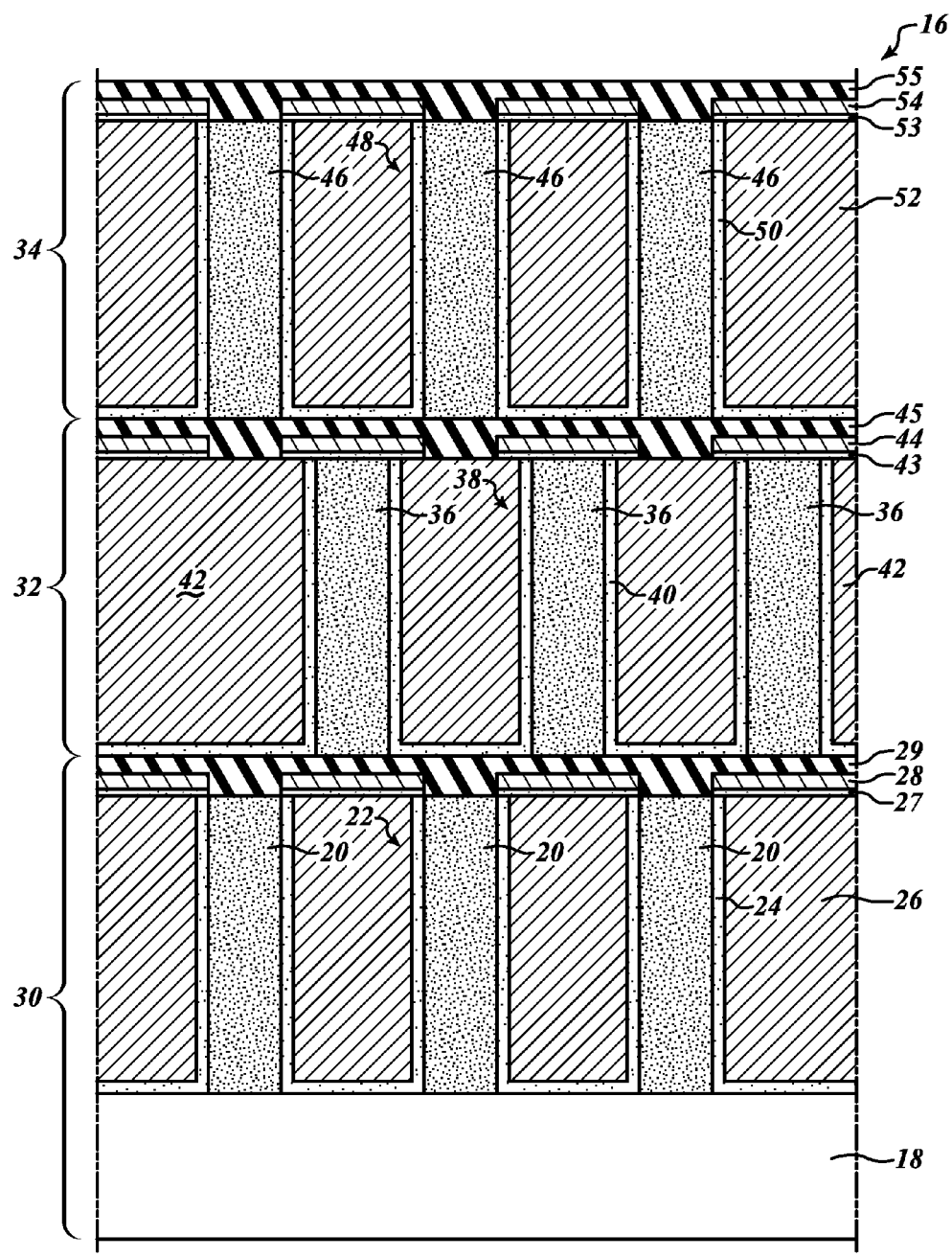
FIG. 12 is a cross-sectional view of a multilayer structure having multiple levels according to one embodiment as disclosed herein.

FIG. 12 is a cross-sectional view of the multilayer structure 16 having multiple levels according to principles disclosed herein. In this example, the multilayer structure 16 includes a first level 30, a second level 32, and a third level 34. The first level 30, the second level 32, and the third level 34 correspond to respective levels, such as metal levels or via levels, of the die 12. The first level 32 includes the support layer 18, the pillars 22 made of the dielectric layer 20, the liner 24, the metal plug layer 26, the liner 27, the wiring layer 28, and the insulating layer 29, as described with respect FIGS. 4A-11B and 13. The second level 32 overlies the first level 30 and includes pillars 38 made of dielectric layer 36, a liner 40, metal plug layer 42, a liner 43, wiring layer 44, and an insulating layer 45. The third level 34 overlies the second level 32 and includes pillars 48 made of dielectric layer 46, a liner 50, metal plug layer 52, liner 53, wiring layer 54, and an insulating layer 55.

Similar to the first level 30, the second level 32 and the third level 34 are each fabricated by using the method described with respect to FIGS. 4A-11B and 13. By performing the method in multiple levels, protection is provided throughout a fabrication process of a die and wafer dicing. As will be discussed in detail with respect to FIG. 13, the fabrication of the multilayer structure shown in FIG. 12 is performed simultaneously with the fabrication of the central region 14. It should be noted that, although three levels are shown in FIG. 12, the method described with respect to FIGS. 4A-11B may be performed for any level of a die. For example, the method may be performed for only a single level of a die, in some or every via level of a die, or in some or every metal interconnection level of a die.

In the embodiment shown in FIG. 12, the pillars of each level of the multilayer structure 16 are positioned at least partially offset from the pillars of adjacent levels of the multilayer structure 16. For example, the pillars 38 are offset from the pillars 22 and the pillars 48 such that the pillars 38 are at least partially aligned with the metal plug layer 26 and the metal plug layer 52 in the vertical direction. The offsetting of pillars from pillars of adjacent levels of the multilayer structure 16 results in overall increased strength of the multilayer structure 16. The pillars 22, 38, and 48, however, may have any arrangement.

FIG. 13 is a cross-sectional view of the central region 14 according to principles disclosed herein. In this example, the central region 14 includes transistors 56, pre-metal dielectric 57, and contact plugs 58 in the first level 30; inter-metal dielectric 59 and contact plugs 60 in the second level 32; and inter-metal dielectric 61 and contact plug 62 in the third level 34.

Most integrated circuits today have at least 7 metal layers, and many have 11-15 metal layers. For each metal layer, there is a corresponding inter-metal dielectric layer and also a plug layer which connects the metal layers above and below the inter-metal dielectric to each other. Accordingly, each time there is a plug layer, the bulk of the volume in the multilevel structure 16 will be made of that plug layer material, whether it be titanium, copper, or the like. Generally, the cross-sectional area occupied by the plug layer in the multilayer structure 16 will be in the range of approximately 62%, though it may also vary to be within the range of 55% to 70% or higher.

The central region 14 is fabricated simultaneously with the fabrication of the multilayer structure 16 shown in FIG. 12. For example, the pre-metal dielectric 57, the inter-metal dielectric 59, and the inter-metal dielectric 61 of FIG. 13 are formed simultaneously with the pillars 22, the pillars 38, and the pillars 48, respectively, of FIG. 12. Similarly, the contact plugs 58, the contact plugs 60, and the contact plug 62 of FIG. 13 are formed simultaneously with the metal plug layer 26, the metal plug layer 42, and the metal plug layer 52, respectively, of FIG. 12. By fabricating the multilayer structure 16 and the central region 14 simultaneously, fabrication time and costs are reduced.

In particular, the steps which are being used to form electrical structures, metal wiring layers, dielectric layers, and interconnection layers to perform the function of the integrated circuit are also used to provide the mechanical structure to prevent cracking of the die in the peripheral region of the chip at the multilayer structure 16. In the peripheral region of the die, the purpose is to provide mechanical strength, and therefore the metal layers may be electrically connected to each other, and all be at a common voltage. Generally, the layer which is the thickest, namely having the greatest height in the electrical circuit portion of the die, as shown in FIG. 13, will be used to occupy the greatest area when that layer is formed in the multilayer structure 16. In some of the upper metal layers, particularly the pad layer and one or two metal layers prior to the pad, the metal wiring layers can become quite thick, and in some instances may be as thick or thicker than the plug layers. In this case, the wiring layers will also occupy a significant portion of the area and may, preferably when they have a height that is approximately equal to or even greater than the plug height, be offset from the plugs so it is another mechanical structure layer and will span from one plug to the other in a similar way that bricks are offset from each other of adjacent brick layers with mortar between. In this case, the dielectric layers 20, 36, and 46 can be compared to the mortar, along with insulation layers 29, 45, and the like, and the various metal plug layers 26, 42, and 52 can be compared to the bricks which provide the mechanical strength. In the event the metal wiring layers are thick, they may also be formed to be laterally offset from adjacent metal layers similar to the way bricks are laid in building a structure offset from each other in adjacent layers.

D. Example Multilayer Structure Having Pads for Damage Testing

Figure 14:
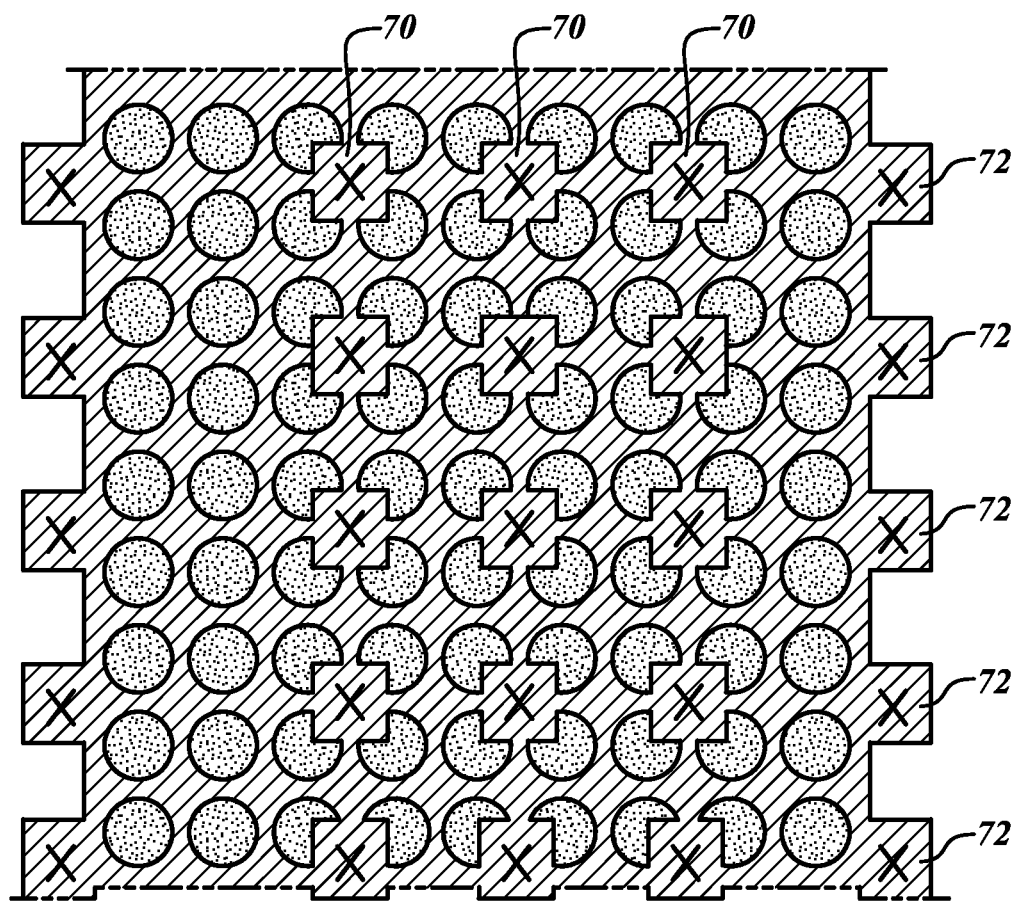
FIG. 14 is a plan view of a multilayer structure having pads according to one embodiment as disclosed herein.

FIG. 14 is a plan view of a multilayer structure having pads according to principles disclosed herein. In this example, a multilayer structure includes inner pads 70 and outer pads 72.

The multilayer structure 16 shown in FIG. 14 is fabricated by using the method described with respect to FIGS. 4A-11B. The inner pads 70 and the outer pads 72 are formed subsequent to the step illustrated in FIGS. 8A-8B and prior to the step illustrated in FIGS. 9A-9B. The inner pads 70 and the outer pads 72 are formed using techniques now known or later developed. A liner, similar to the liner 24 of FIGS. 8A-8B, is not shown in FIG. 14 for simplicity reasons.

The inner pads 70 and the outer pads 72 provide contact points and the metal provides an electrical channel for electrical probes used test whether a die has any damage. For example, an electrical probe may be used to test the resistivity between two pads to determine whether any cracks are present in a die. Similarly, the pillars and the liner may provide optical channels and optical reflection layers, respectively, for optical probes used test whether a die has any damage. In one embodiment, as will be discussed in detail with respect to FIGS. 15-17, a multilayer structure includes passive electrical components, such as inductors, resistors, and capacitors, to increase the sensitivity of testing.

When a multilayer structure includes multiple levels, the testing described with respect to FIG. 14 is performed at each level. For example, for the embodiment shown in FIG. 12, inner pads and outer pads may be formed on the multilayer structure 16 and testing may be performed just prior to each of the liners 27, 43, and 53 being formed. By testing the multilayer structure 16 at multiple levels, damages to the die 12 can be detected throughout the fabrication process of the die 12 and subsequent to wafer dicing.

E. Example Multilayer Structure Having Passive Electrical Components

Figure 15:
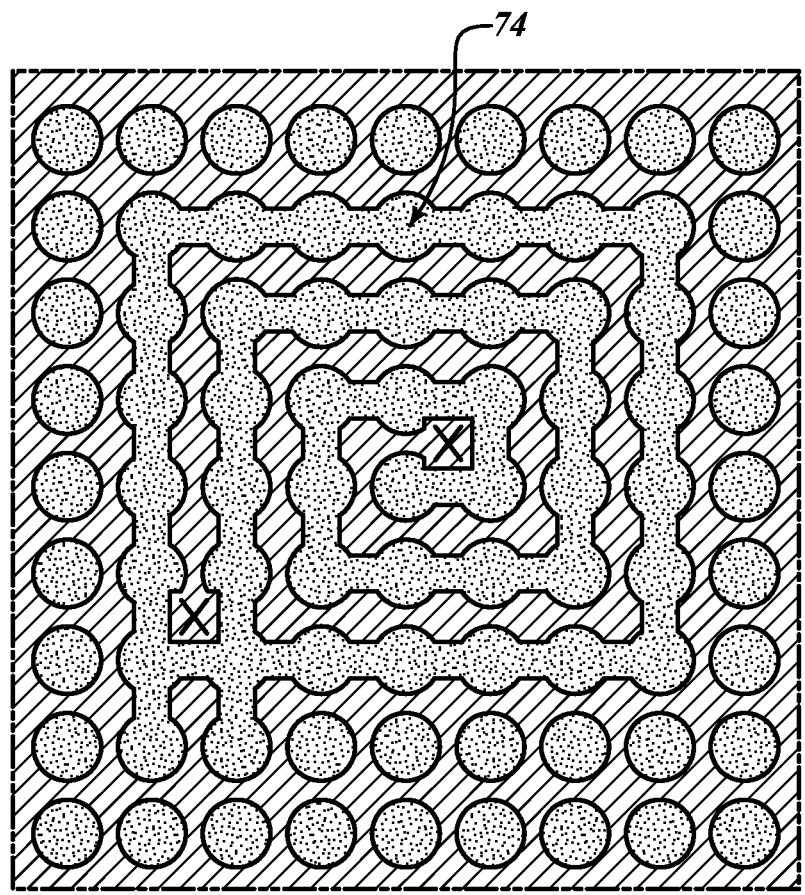
FIGS. 15-17 are plan views of multilayer structures having various passive electrical components according to embodiments disclosed herein.
Figure 16:
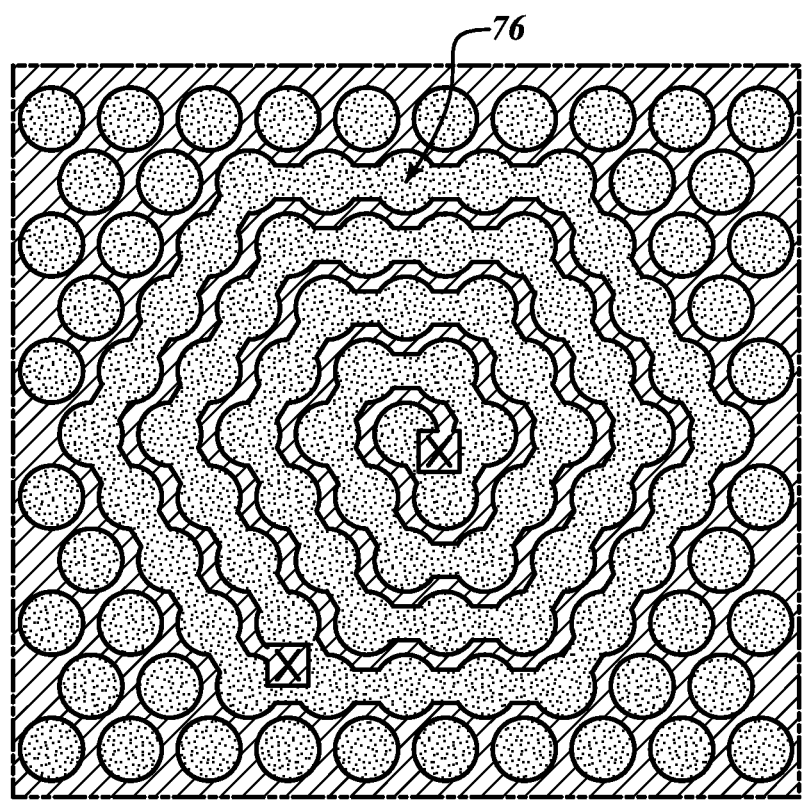
Figure 17:
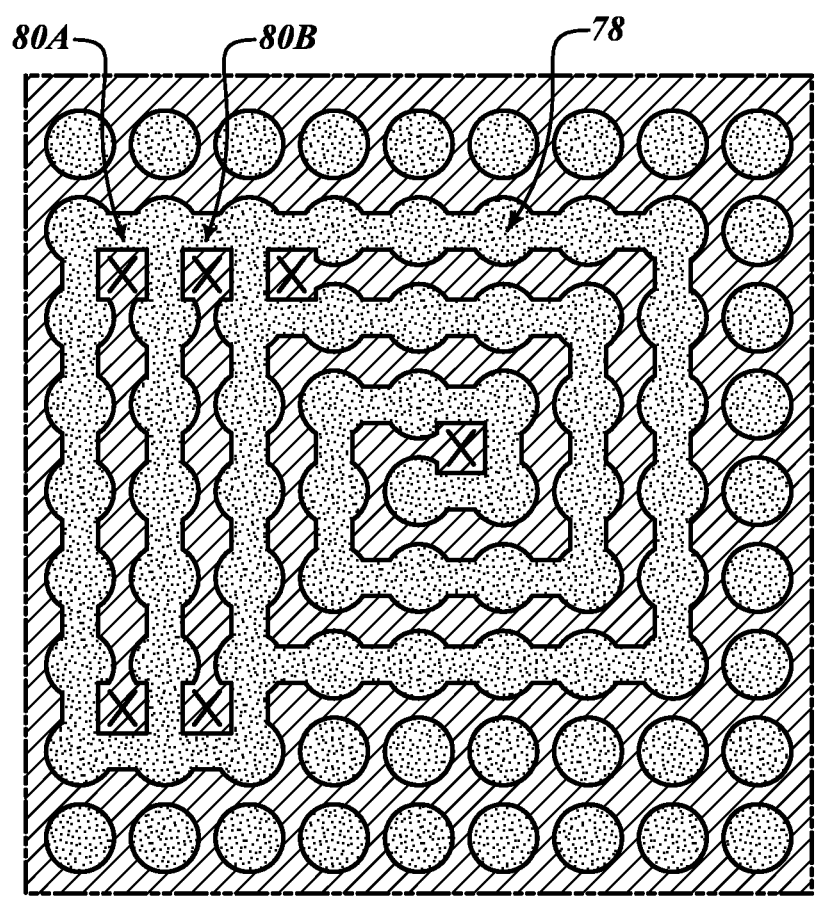

FIGS. 15-17 are plan views of multilayer structures having various passive electrical components according to principles disclosed herein.

In the embodiments shown in FIGS. 15-17, a multilayer structure includes a passive electrical component, such as an inductor, a resistor, and a capacitor, that is formed by the dielectric and the metal of the multilayer structure. Passive electrical components are used to increase the sensitivity of the testing described with respect to FIG. 14 by detecting damages based on a measured electrical characteristic of the passive electrical components. For example, damage to a die may be determined based on whether a measured electrical characteristic of a passive electrical component is within a predetermined range of a predetermined value.

FIG. 15 is a plan view illustrating an example multilayer structure having an inductor 74 according to one embodiment. In this embodiment, a measured inductance between the two pads of the inductor 74 is compared to a predetermined value to determine whether the die has any damage.

FIG. 16 is a plan view illustrating an example multilayer structure having an inductor 76 according to another embodiment. In this embodiment, a measured inductance between the two pads of the inductor 76 is compared to a predetermined inductance to determine whether the die has any damage.

FIG. 17 is a plan view illustrating an example multilayer structure having a plurality of passive electrical components according to a further embodiment. In this example, the multilayer structure includes an inductor 78, a resistor 80A, and a resistor 80B. By having multiple passive electrical components, the robustness of the testing described with respect to FIG. 14 can be improved.

In this embodiment, a measured inductance between the two pads of the inductor 78 is compared to a predetermined value to determine whether the die has any damage. In addition, measured resistances of the resistor 80A and the resistor 80B are each compared to predetermined values to determine whether the die has any damage. For example, the voltage difference between the two pads of resistor 80A may be measured to determine the resistance of the resistor 80A. The resistance of the resistor 80A can then compared to a predetermined value to determine whether the die has any damage.

In another embodiment, the resistor 80A, the resistor 80B, and the dielectric between the resistor 80A and the resistor 80B are used together as a capacitor. Particularly, the resistor 80A and the resistor 80B may be used as first and second electrodes, respectively, and the dielectric between the resistor 80A and the resistor 80B may be used as an insulator. A measured capacitance between the resistor 80A and the resistor 80B is then compared to a predetermined value to determine whether the die has any damage.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming transistor components in a first region of a substrate;
   forming a first plurality of dielectric pillars overlying the substrate in a second region of the substrate, each of the first plurality of dielectric pillars including a side surface;

forming a first liner overlying the substrate and the side surfaces of the first plurality of dielectric pillars in the second region;

forming a first metal plug layer overlying the first liner and filling spaces between the side surfaces of the first plurality of dielectric pillars in the second region;

forming a first metal wiring layer overlying the first region of the semiconductor substrate that electrically connects transistors to each other;

forming an insulation layer overlying the first plurality of dielectric pillars, the first liner, the first metal plug layer, and the first metal wiring layer;

forming a second plurality of dielectric pillars overlying the insulation layer in the second region, each of the second plurality of dielectric pillars including a side surface, a plurality of the second plurality of dielectric pillars being located overlying the first metal plug layer and not overlying a plurality of the first plurality of dielectric pillars;

forming a second liner overlying the insulation layer and the side surfaces of the second plurality of dielectric pillars in the second region; and forming a second metal plug layer overlying the second liner and filling spaces between the side surfaces of the second plurality of dielectric pillars in the second region.

2. The method of claim 1, wherein the first region is a central region of the substrate and the second region is a peripheral region of the substrate that surrounds the central region of the substrate.

3. The method of claim 1, wherein the forming of the first metal plug layer simultaneously forms contact plugs in the first region.

4. The method of claim 1, wherein the forming of the first plurality of dielectric pillars includes patterning a dielectric layer using a via mask.

5. The method of claim 1, further comprising:
forming, prior to the forming of the insulation layer, a plurality of contact pads on the first metal plug layer in the second region; and
detecting, prior to the forming of the insulation layer, damages based on an electrical characteristic between two contact pads of the plurality of contact pads.

6. The method of claim 1, further comprising detecting, prior to the forming of the insulation layer, damages based on an optical characteristic of a dielectric pillar of the first plurality of dielectric pillars.

7. The method of claim 1, further comprising forming a passive electrical component overlying the substrate in the second region.

8. The method of claim 7, wherein the passive electrical component is a resistor, a capacitor, or an inductor.

9. An integrated circuit, comprising:
a substrate having a central region and a peripheral region that surrounds the central region;
a plurality of transistor components in the central region;
a first plurality of dielectric pillars overlying the substrate in the peripheral region, each of the first plurality of dielectric pillars including a side surface;
a first liner overlying the substrate and the side surfaces of the first plurality of dielectric pillars in the peripheral region;
a first metal plug layer overlying the first liner and filled between the side surfaces of the first plurality of dielectric pillars in the peripheral region;
a first metal wiring layer overlying the central region that electrically connects transistors to each other;
an insulation layer overlying the first plurality of dielectric pillars, the first liner, the first metal plug layer, and the first metal wiring layer;
a second plurality of dielectric pillars overlying the insulation layer in the peripheral region, each of the second plurality of dielectric pillars including a side surface, a plurality of the second plurality of dielectric pillars being located overlying the first metal layer and not overlying a plurality of the first plurality of dielectric pillars;
a second liner overlying the insulation layer and the side surfaces of the second plurality of dielectric pillars in the peripheral region; and
a second metal layer overlying the second liner and filled between the side surfaces of the second plurality of dielectric pillars in the peripheral region.

10. The integrated circuit of claim 9, further comprising a plurality of contact pads formed between the first metal plug layer and the insulation layer in the peripheral region.

11. The integrated circuit of claim 9, further comprising a passive electrical component overlying the substrate in the peripheral region.

12. The integrated circuit of claim 11, wherein the passive electrical component is a resistor, a capacitor, or an inductor.

13. An integrated circuit, comprising:
a substrate having a central region and a peripheral region that surrounds the central region;
a plurality of electrical components in the central region; and
a multilayer structure in the peripheral region, the multilayer structure, including:
a first plurality of dielectric pillars overlying the substrate, each of the first plurality of dielectric pillars including a side surface;
a first liner overlying the substrate and the side surfaces of the first plurality of dielectric pillars;
a first metal plug layer overlying the first liner and filled between the side surfaces of the first plurality of dielectric pillars;
an insulation layer overlying the first plurality of dielectric pillars, the first liner, and the first metal plug layer;
a second plurality of dielectric pillars overlying the insulation layer, each of the second plurality of dielectric pillars including a side surface, a plurality of the second plurality of dielectric pillars being located overlying the first metal layer and not overlying a plurality of the first plurality of dielectric pillars;
a second liner overlying the insulation layer and the side surfaces of the second plurality of dielectric pillars; and
a second metal plug layer overlying the second liner and filled between the side surfaces of the second plurality of dielectric pillars.

14. The integrated circuit of claim 13, further comprising a plurality of contact pads formed between the first metal plug layer and the insulation layer in the peripheral region.

15. The integrated circuit of claim 13, further comprising a passive electrical component overlying the substrate in the peripheral region.

16. The integrated circuit of claim 15, wherein the passive electrical component is a resistor, a capacitor, or an inductor.

* * * * *